(12) United States Patent
Herzog et al.

(10) Patent No.: US 6,205,031 B1
(45) Date of Patent: Mar. 20, 2001

(54) ELECTRONIC CONTROL APPARATUS

(75) Inventors: Achim Herzog, Backnang; Jürgen Spachmann, Sersheim; Uwe Wagner, Vaihingen; Thomas Raica, Hechingen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/254,019

(22) PCT Filed: Mar. 4, 1998

(86) PCT No.: PCT/DE98/00621

§ 371 Date: Dec. 22, 1999

§ 102(e) Date: Dec. 22, 1999

(87) PCT Pub. No.: WO99/00845

PCT Pub. Date: Jan. 7, 1999

(30) Foreign Application Priority Data

Jun. 28, 1997 (DE) ............................................. 197 27 548

(51) Int. Cl.$^7$ ...................................................... H05K 1/14
(52) U.S. Cl. ........................... 361/760; 361/633; 361/640; 361/765; 361/785; 439/65; 439/69; 257/723; 257/724; 174/524; 174/117 F; 174/260; 174/261
(58) Field of Search .................................. 361/760, 633, 361/640, 765, 785, 792, 794, 736; 439/65, 69, 70, 74; 123/146.5 B, 643; 257/692, 701, 723, 724; 174/52.1, 52.4, 117 F, 260, 261

(56) References Cited

U.S. PATENT DOCUMENTS

| | | | | |
|---|---|---|---|---|
| 4,074,342 | * | 2/1978 | Honn et al. ............................ | 361/779 |
| 4,518,211 | * | 5/1985 | Stepan et al. ............................ | 439/74 |
| 5,159,532 | * | 10/1992 | Kilian et al. ............................ | 361/709 |
| 5,319,243 | * | 6/1994 | Leicht et al. ............................ | 257/692 |
| 5,488,256 | * | 1/1996 | Tsunoda ................................ | 257/723 |
| 5,581,130 | * | 12/1996 | Boucheron ............................ | 307/10.1 |
| 5,610,371 | * | 3/1997 | Hashimoto et al. .................. | 174/262 |
| 5,642,253 | * | 6/1997 | Shreve ................................ | 361/152 |
| 5,699,230 | * | 12/1997 | Ota ........................................ | 361/736 |
| 5,703,757 | * | 12/1997 | Hayes et al. .......................... | 361/752 |

FOREIGN PATENT DOCUMENTS

| | | |
|---|---|---|
| 27 53 145 | 6/1979 | (DE) . |
| 36 24 845 | 1/1988 | (DE) . |
| 39 33 084 | 4/1991 | (DE) . |
| 40 35 526 | 5/1992 | (DE) . |
| 0 278 432 | 8/1988 | (EP) . |
| 0 516 149 | 12/1992 | (EP) . |
| 0 578 108 | 1/1994 | (EP) . |
| 0 697 732 | 2/1996 | (EP) . |

* cited by examiner

Primary Examiner—Jayprakash N. Gandhi
Assistant Examiner—David Foster
(74) Attorney, Agent, or Firm—Kenyon & Kenyon

(57) ABSTRACT

An electronic control unit having a housing, a substrate, particularly a hybrid, arranged in the housing and having an electronic control circuit. The electronic control unit also includes at least one device plug secured to the housing having contact elements that are electrically conductively connected to the control circuit of the substrate. A second substrate is arranged in the housing, spatially separated from the first substrate. At least one power component disposed in the housing and, electrically connected to the control circuit on the first substrate. One connecting printed circuit trace disposed in housing and conductively connected to the power component. The connecting printed circuit trace are conductively connected to a contact element, conducting power currents, of the device plug. Using the arrangement, in the event of a large number of contact elements in a device plug, the electrical connecting of the contact elements to the substrate can be simplified. Moreover, the printed circuit trace layout is simplified, an improvement in the EMC protection is achieved, and the dissipation of heat generated by the power component is improved.

16 Claims, 1 Drawing Sheet

ELECTRONIC CONTROL APPARATUS

German Patent No. 36 24 845 describes, a control unit for an electronic ignition system which has a device plug fastened on the housing of the control unit, the device plug being provided with a multiplicity of contact elements. Routed in an insulated manner through the housing, the contact elements of the device plug are connected within the housing to a control circuit arranged on a hybrid plate via bonding wires and are configured outside the housing in the shape of connector lugs that can be coupled with suitably formed counter-contact elements of a cable harness plug. A control unit of this type is normally installed in the engine compartment of a motor vehicle. The electrical connection to the engine components, e.g., the ignition coils, sensors arranged on the engine or adjustment elements or the connection to components arranged elsewhere in the motor vehicle is established via the cable harness plug.

The disadvantage with the conventional control unit describe above is that all components needed for the different functions of the control unit and the associated connecting printed circuit traces are arranged on the hybrid arranged in the control unit. Since some of these components, particularly power components or capacitors, are relatively large, they require much space on the top side of the hybrid. Moreover, for example, power output stages require low-resistance connection lines, the printed circuit traces being routed to these large components to some extent in an inconvenient manner, which degrades the electromagnetic compatibility, makes the printed circuit trace routing (layout) more difficult and results in an undesired enlargement of the hybrid. Components such as ignition transistors are soldered on to carrier modules which in turn are mounted and contacted on the substrate, thereby further increasing the space requirement. Now, however, there is an increasing demand for ever smaller control units which require little space in the engine compartment. Another difficulty is that the device plugs of the control units have more and more contact elements which must be contacted with connections of the circuit on the hybrid, so that it becomes more difficult, if the hybrid is reduced in size, to place all connections in the direct vicinity of the device plug on the hybrid. It is particularly disadvantageous that the connecting printed circuit traces of the power components must be designed to conduct higher power currents compared to the signal currents and thus have a larger cross-section so that the space requirement on the hybrid increases even further with the number of connecting printed circuit traces for power components.

Moreover, the heat generated by the power components on the housing of the control unit must be dissipated to prevent overheating. Since ceramic multilayer substrates such as LTCC substrates have poor thermal conductivity, this is generally achieved by providing thermal plated-through holes, known as vias, in the substrate. However, as the number of vias increases, the disentanglement of the printed circuit trace layout of the multilayer substrate becomes increasingly expensive.

SUMMARY OF THE INVENTION

A control unit according to the present invention generally avoids the disadvantages described above. With a second substrate arranged in the control unit housing on which power components are arranged having their connecting printed circuit traces, it is advantageously achieved that for device plugs having many pins with a large number of contact elements, a connection of the contact elements to the electronic circuit is simplified by a more flexible printed circuit trace layout. Large components such as tantalum capacitors, power components such as ignition transistors can be accommodated directly on the second substrate without an additional carrier module. The first substrate can thus be specified (made) smaller, which is desirable particularly with expensive LTCC (low temperature cofired ceramic) substrates. The possibility to manufacture the second substrate from a different material than the first substrate is particularly advantageous. For example, an LTCC substrate provided with a hybrid circuit can be used as the first substrate and a cost-effective DBC (direct bonded copper) substrate as the second substrate. Since manufacture of large-area, metallic printed circuit traces on the DBC substrate entails no difficulties, the power currents can be advantageously connected via the low-resistance connecting printed circuit traces of the DBC substrate to the power components accommodated there. This simplifies not only the printed circuit trace layout but also achieves an improvement in the electromagnetic compatibility (EMC protection). Moreover, there is also the possibility of manufacturing the second substrate from a material such as $AlO_2$ with good thermal conductivity, thereby achieving an improved heat dissipation of the heat produced by the power components without having to provide thermal vias for this purpose.

It is also advantageous, in an electronic control unit in which two device plugs are arranged having contact elements, some of which are designed to conduct power currents and which must be looped through the control unit without interconnecting components, to additionally provide on the second substrate lead-through printed circuit traces which directly connect the contact elements of the two plugs to one another. It is advantageously achieved in this manner that, for example, no electrical bus bars or cable connections that are expensive to connect are required to carry the power currents through the control unit.

Since the second substrate is arranged spatially separated from the first substrate in the control unit housing and the contact elements of the at least one device plug must be connected to both substrates, it is advantageous for bridging smaller distances to connect the connecting printed circuit traces and the lead-through printed circuit traces of the second substrate via bonding wires to the contact elements. The second substrate is arranged for this purpose in the vicinity of the power-current-carrying high-current contact elements of the at least one device plug.

Additionally, lines carrying power currents can also be provided advantageously on the second substrate, which, for example, are connected via bonding wires to contact surfaces on the first substrate, which contact surfaces are connected conductively in turn via a short path to a power component on the first substrate.

In addition, to simplify the printed circuit trace layout on the first substrate, it is advantageous to also arrange, besides the printed circuit traces conducting power currents, some printed circuit traces carrying signal currents on the second substrate. It can be achieved advantageously in this manner, for example, that the signal currents can be led from the contact elements of a device plug via the second substrate in a simple manner to further, remotely lying circuit parts of the first substrate.

It is also advantageous that large components such as tantalum capacitors can be accommodated directly on the second substrate and connected there to the ends of the printed circuit traces since such components would require too much space on the first substrate.

In addition, it is advantageous to provide as the second substrate a DBC (direct bonded copper) substrate which is economical and simple to manufacture and exhibits good thermal conductivity properties. Such substrates are especially well suited to heat dissipation of extreme loading peaks. Individual components such as chip diodes having the anode optionally on the back side or the front side can be accommodated with the aid of a bond option on the DBC substrate and can thus be used flexibly.

DETAILED DESCRIPTION

Figure 1:
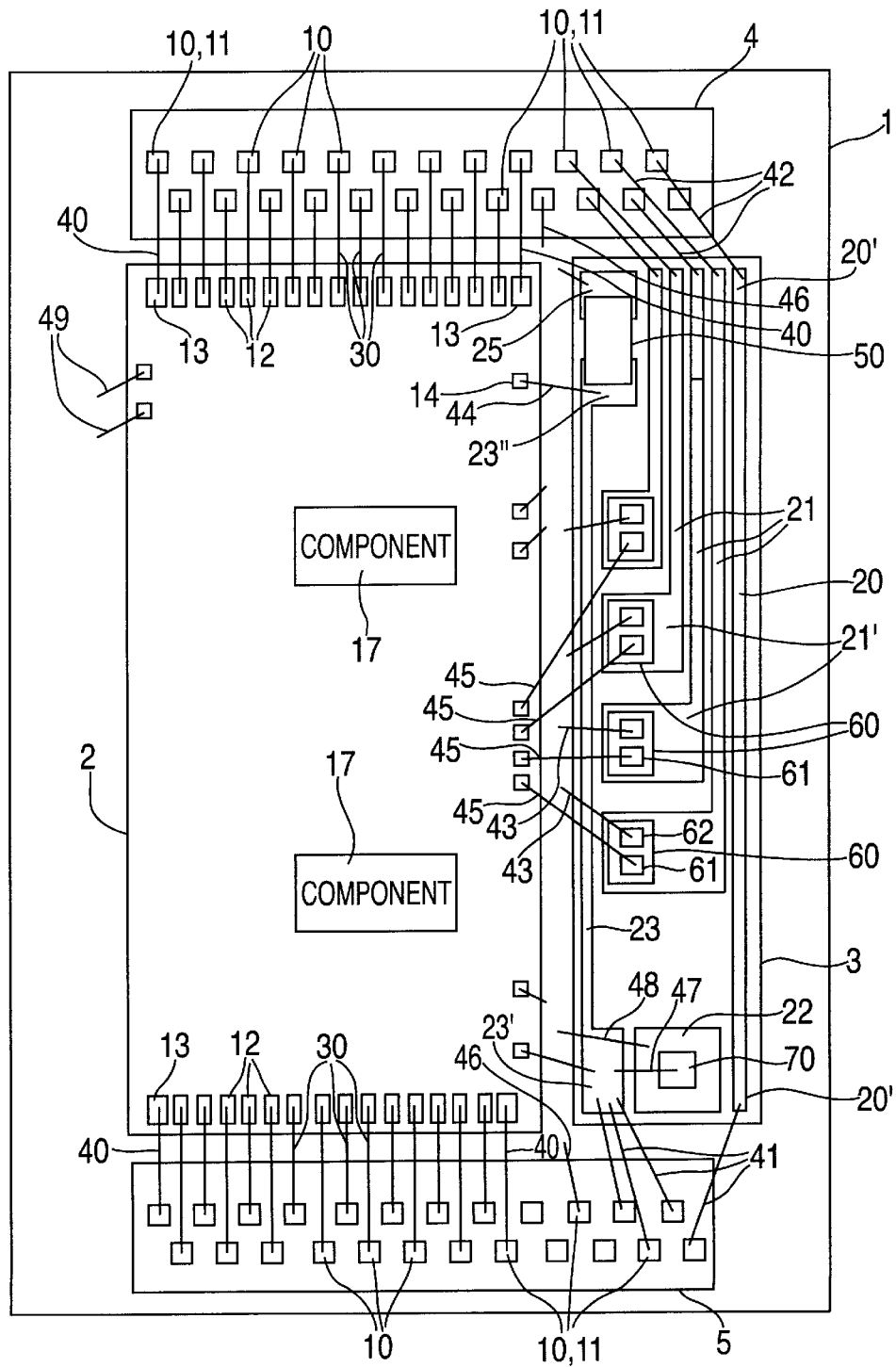
FIG. 1 shows a cut-out of an inner part of a control unit having a hybrid and a direct bonded copper (DBC) substrate and two device plugs fastened on a device housing.

FIG. 1 shows schematically the inner part of housing 1 of a control unit which is used, for example, for the electronic control of the ignition of an internal combustion engine in a motor vehicle. Housing 1 includes a ring-shaped side wall (not shown) and a base part having a substrate 2 glued thereupon. Housing 1 is closable with a cover (not shown) so that substrate 2 is arranged in a protected manner in the housing. Substrate 2 is preferably an LTCC substrate provided with a microhybrid circuit. However, other ceramic substrates or even printed circuit board substrates can also be used. On the LTCC substrate, there is an electronic control circuit having components 17, such as resistors, capacitors, ICs or microprocessors, as well as printed circuit traces (not shown in FIG. 1) connecting them, which are manufactured in a known manner from electrical conducting paste on, or in, the LTCC substrate. On the top side of substrate 2, connection surfaces 12, 13 are provided for electrical connection of the circuit to two device plugs 4, 5. Device plugs 4, 5 are inset in one opening each of the base part of housing 1 on opposite sides of substrate 2 and have a plurality of contact elements 10 designed as plug pins. Contact elements 10 are routed out of housing 1 on the outer side of housing 1 facing away from substrate 1 and can be coupled there to the contact elements of suitably designed mating connectors. Connected to the mating connector to device plug 4, the so-called engine plug, is a cable harness, which is connected, for example, to the ignition coils of the motor vehicle. Connected to the mating connector to second device plug 5, the so-called vehicle plug, is a further cable harness, which is connected to the battery, the sensors, temperatures probes and other components in the interior of the motor vehicle.

Contact elements 10 of device plugs 4, 5, which are provided to conduct signal currents, are connected via fine bonding wires 30 made of gold, shown in FIG. 1 by thin lines, to connection surfaces 12 on substrate 2. Of contact elements 10 of the device plugs, some contact elements 11 for conducting power currents are bonded to thick bonding wires 40, 41, 42, made of aluminum. In FIG. 1, it can be seen that most of contact elements 11 carrying power currents of device plug 4 are connected via bonding wires 42 to connecting printed circuit traces 21 on a second substrate 3. Second substrate 3 is manufactured as a DBC substrate or AlO₂ substrate and is arranged in housing 1 next to first substrate 2 between two device plugs 4, 5. Printed circuit traces 20, 21, 23 on second substrate 3 are manufactured as large-area, metallic printed circuit traces made of copper or silver. As can be further seen in FIG. 1, the ends of connecting printed circuit traces 21 facing away from bonding wires 42 are designed as large-area connection surfaces 21'. On each connection surface 21', an ignition transistor 60 is directly accommodated as a power component, the collector contacting the associated connecting printed circuit trace 21 on the bottom side of the transistor. Emitter 62 of each transistor 60 is connected via a bonding wire 43 to ground. Base 61 of each transistor 60 is connected via bonding wires 45 to the circuit on first substrate 2. The power currents from power components 60 are advantageously drawn off via metallic connecting printed circuit traces 21 directly to bonding wires 42 and contact elements 11 of device plug 4, and from there via the cable harness on the engine side to the ignition coils.

As can be also seen in FIG. 1, some of contact elements 11 conducting power currents can also be connected in a conventional manner via bonding wires 40 to contact surfaces 13 on hybrid substrate 2 or via bonding wires 46 to housing 1.

FIG. 1 shows a lead-through printed circuit trace 20 provided on the DBC substrate. End region 20' facing device plug 5 of lead-through printed circuit trace 20 is connected via a bonding wire 41 to at least one high-current contact element 11 of device plug 5. Opposite end region 20" of lead-through printed circuit trace 20 is connected conductively, without interconnection of further components, to a contact element 11 via a bonding wire 42. Via lead-through printed circuit traces 20, high power currents can be routed or "looped" directly through the control unit without interconnection of components.

Moreover, a printed circuit trace 23 is provided whose one end region 23' is connected via multiple bonding wires 41 to contact elements 11, carrying power currents, of second device plug 5 and whose opposite end region 23" is connected via a bonding wire 44 to a connection surface 14 on first substrate 2, connection surface 14 being in turn conductively connected in turn to a power component (not shown) on the first substrate. Since surface element 14 is located on the end of hybrid 2 opposite end region 23', it is thus achieved that the power current can be routed essentially via printed circuit trace 23 to a power component, connected to surface element 14, on first substrate 2. End region 23", connected to connection surface 14, of printed circuit trace 23 is connected to a capacitor 50 accommodated in the end region of the DBC substrate, interfering currents being drawn off to surface element 25 via capacitor 50 and from there via a bonding wire to housing 1.

Additionally, it is possible to provide on second substrate (3) also printed circuit traces (not shown in FIG. 1) carrying signal currents whose one end is connected to a contact element (10) of a device plug (4, 5) and whose other end is connected conductively to circuit connections on first substrate (2). In this manner, the printed circuit trace layout on first substrate 2 can be further simplified.

In addition, chip diode components 70 are provided for limiting voltage peaks. As is shown in FIG. 1, chip diode components 70 are accommodated with the anode on the top side or the bottom side on a printed circuit trace 22 of DBC substrate 3. The two poles of the diode are connected via bonding wires 47 and 48 to printed circuit trace 23 or rather to housing base 1. If the poles of the diode are exchanged, the diode is connected via bonding wire 47 to housing 1 and via bonding wire 48 to printed circuit trace 23.

What is claimed is:

1. An electronic control unit, comprising:
   a housing;
   a first substrate situated in the housing and including an electronic control circuit;

at least one device plug secured to the housing and including contact elements which are electro-conductively connected to the electronic control circuit of the first substrate;

a second substrate situated in the housing, the second substrate being disposed at a predetermined distance from the first substrate;

at least one power component electrically connected to the electronic control circuit of the first substrate; and at least one connecting printed circuit trace conductively connected to the at least one power component and to at least one particular element of the contact elements, the at least one particular element conducting power currents, wherein the at least one power component and the at least one connecting printed circuit trace are disposed on the second substrate.

2. The electronic control unit according to claim 1, further comprising:

a further device plug arranged in the housing and including further plug elements; and at least one lead-through printed circuit trace disposed on the second substrate and extending between the at least one device plug and the further device plug, wherein the at least one lead-through printed circuit trace is conductively connected to the at least one particular element and to at least one further element of the further plug elements without being connected to further components, the at least one further element conducting the power currents.

3. The electronic control unit according to claim 2, wherein the at least one connecting printed circuit trace and the at least one lead-through printed circuit trace are connected to the at least one particular element and the at least one further element via bonding wires, and wherein the at least one power component is connected to the electronic control circuit via the bonding wires.

4. The electronic control unit according to claim 2, further comprising:

a capacitor connected to an end region of the at least one lead-through printed circuit trace.

5. The electronic control unit according to claim 1, wherein the at least one connecting printed circuit trace is connected to the at least one particular element via bonding wires, and wherein the at least one power component is connected to the electronic control circuit via the bonding wires.

6. The electronic control unit according to claim 1, further comprising:

at least one further circuit trace disposed on the second substrate and conducting the power currents, wherein a first end of the at least one further circuit trace is conductively connected to a high-current element of the contact elements, and wherein a second end of the at least one further circuit trace is conductively connected to a contact surface provided on the first substrate.

7. The electronic control unit according to claim 6, further comprising:

a capacitor connected to at least one of the first end and the second end of the at least one further circuit trace.

8. The electronic control unit according to claim 1, further comprising:

at least one further circuit trace disposed on the second substrate and conducting the power currents, wherein a first end of the at least one further circuit trace is connected to at least one element of the contact elements, and wherein a second end of the at least one further circuit trace is conductively connected to circuit connections provided on the first substrate.

9. The electronic control unit according to claim 1, further comprising:

a further device plug disposed in the housing; and at least one lead-through printed circuit trace disposed on the second substrate and extending between the at least one device plug and the further device plug, wherein the second substrate is a direct bonded copper (DBC) substrate, the DBC substrate being composed of a ceramic carrier plate having a predetermined thermal conductivity, and wherein the at least one lead-through printed circuit trace is applied on a top side of the DBC substrate.

10. The electronic control unit according to claim 9, wherein the at least one lead-through printed circuit trace is composed of a copper material.

11. The electronic control unit according to claim 9, further comprising:

at least one chip diode component disposed on the second substrate and insulated from the at least one lead-through printed circuit trace and the at least one connecting printed circuit trace.

12. The electronic control unit according to claim 11, wherein the at least one chip diode component has one of an anode and a cathode on a bottom side of the at least one chip diode component, the bottom side facing the second substrate.

13. The electronic control unit according to claim 1, further comprising:

a further device plug disposed in the housing; and at least one lead-through printed circuit trace disposed on the second substrate and extending between the at least one device plug and the further device plug, wherein the second substrate is an $AlO_2$ ceramic substrate, and wherein the at least one lead-through printed circuit trace is composed of a silver material.

14. The electronic control unit according to claim 13, further comprising:

at least one chip diode component disposed on the second substrate and being insulated from the at least one lead-through printed circuit trace and the at least one connecting printed circuit trace.

15. The electronic control unit according to claim 14, wherein the at least one chip diode component has one of an anode and a cathode on a bottom side of the at least one chip diode component, the bottom side facing the second substrate.

16. The electronic control unit according to claim 1, wherein the first substrate includes a hybrid.

* * * * *